(12) United States Patent
Jenkins et al.

(10) Patent No.: US 7,095,264 B2
(45) Date of Patent: Aug. 22, 2006

(54) PROGRAMMABLE JITTER SIGNAL GENERATOR

(75) Inventors: Keith A. Jenkins, Sleepy Hollow, NY (US); Jien-Chung Lo, Kingston, RI (US); Peilin Song, Lagrangeville, NY (US); Tian Xia, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 10/725,847

(22) Filed: Dec. 2, 2003

(65) Prior Publication Data

US 2005/0116759 A1 Jun. 2, 2005

(51) Int. Cl.
*H03H 11/26* (2006.01)

(52) U.S. Cl. .................................. 327/276; 327/317
(58) Field of Classification Search ......... 327/276–281, 327/317, 261–265, 153, 158, 161
See application file for complete search history.

(56) References Cited

U.S. PATENT DOCUMENTS

| | | | | |
|---|---|---|---|---|
| 5,103,185 A | * | 4/1992 | Arai | 327/292 |
| 6,285,197 B1 | * | 9/2001 | Walker | 324/603 |
| 6,384,661 B1 | * | 5/2002 | Livolsi | 327/379 |
| 6,404,257 B1 | * | 6/2002 | Livolsi | 327/276 |
| 6,593,871 B1 | * | 7/2003 | Miethig et al. | 341/157 |

FOREIGN PATENT DOCUMENTS

JP          03278376 A  * 12/1991

* cited by examiner

*Primary Examiner*—Linh My Nguyen
(74) *Attorney, Agent, or Firm*—F. Chau & Associates, LLC

(57) ABSTRACT

A programmable jitter signal generator is provided that includes a jitter distribution control unit, a selection unit in signal communication with the jitter distribution control unit, and a delay unit in signal communication with the selection unit; and a corresponding method of generating a programmable jitter signal includes programming a control unit, receiving a reference signal, delaying the received reference signal by a multiple of a base time increment, and selecting a delayed reference signal delayed by a desired multiple of the base time increment in accordance with the programmed control unit.

19 Claims, 7 Drawing Sheets

PROGRAMMABLE JITTER SIGNAL GENERATOR

BACKGROUND OF THE INVENTION

The present invention relates generally to the testing of timing jitter, and in particular, to an apparatus and method for providing a programmable jitter signal generator. Timing jitter is defined as the short-term deviation in significant instants of digital signals as referenced to their equidistant normal instants.

As shown in FIG. 1, an exemplary plot of jitter is indicated generally by the reference numeral 100. The solid square wave 110 represents a jitter-free reference signal where the rising edges and falling edges are equally distant from each other. The dashed square waves 112 and 114 are signals with early transition and late transition jitter, respectively. By comparing the timing instant of the rising edges or falling edges between these signals and the reference signal 110, it can be seen there are timing deviations. These timing deviations are called timing jitter.

In today's high-speed computing and communications systems, jitter is a crucial parameter. It is important for such systems to minimize the impact from the timing jitter, and to tolerate a certain level of timing jitter in the input signal while maintaining performance. Accordingly, high-speed computing and communications system must be tested for their tolerance to jitter.

Turning to FIG. 2, a test setup for testing system jitter tolerance ability is indicated generally by the reference numeral 200. The setup 200 includes three blocks, a jitter signal generator 210, a system under test 212 in signal communication with the generator 210, and a system response analyzer 214 in signal communication with the system 212.

In operation of a test, the jitter signal generator 210 generates a signal with known jitter and applies it to the system under test 212. The output of the system under test is its response to the input with jitter. This response is passed into the system response analyzer block 214, where the system jitter tolerance is evaluated.

To conduct the jitter tolerance test, the type of jitter signal generator used is of paramount importance. It should be able to generate jitter in a controllable fashion and then deliberately inject the jitter into the data stream. A traditional method uses a frequency modulation ("FM") technique to modulate a low frequency sinusoidal signal onto a carrier frequency sinusoidal signal, which in turn triggers a pulse generator. In this method, most of the jitter parameters cannot be controlled, such as jitter distribution, jitter amplitude and the like. Thus, the system's jitter tolerance characteristics cannot be evaluated completely and accurately.

For instance, in phase locked loop ("PLL") testing, the transfer function and input jitter caused output jitter cannot be easily determined. Similarly, in high-speed transceiver and A/D converter testing, jitter tolerance cannot be completely tested. Accordingly, what is needed is a controllable jitter generation technique to overcome these and other drawbacks and disadvantages of the prior art.

SUMMARY OF THE INVENTION

The above and other drawbacks and deficiencies of the prior art are overcome or alleviated by a programmable jitter signal generator.

A programmable jitter signal generator is provided that includes a jitter distribution control unit, a selection unit in signal communication with the jitter distribution control unit, and a delay unit in signal communication with the selection unit; and a corresponding method of generating a programmable jitter signal includes programming a control unit, receiving a reference signal, delaying the received reference signal by a multiple of a base time increment, and selecting a delayed reference signal delayed by a desired multiple of the base time increment in accordance with the programmed control unit.

These and other aspects, features and advantages of the present disclosure will become apparent from the following description of exemplary embodiments, which is to be read in connection with the accompanying drawings.

BRIEF DESCRIPTION OF THE DRAWINGS

The present invention may be better understood with reference to the following exemplary figures, in which.

DETAILED DESCRIPTION OF PREFERRED EMBODIMENTS

Figure 1:
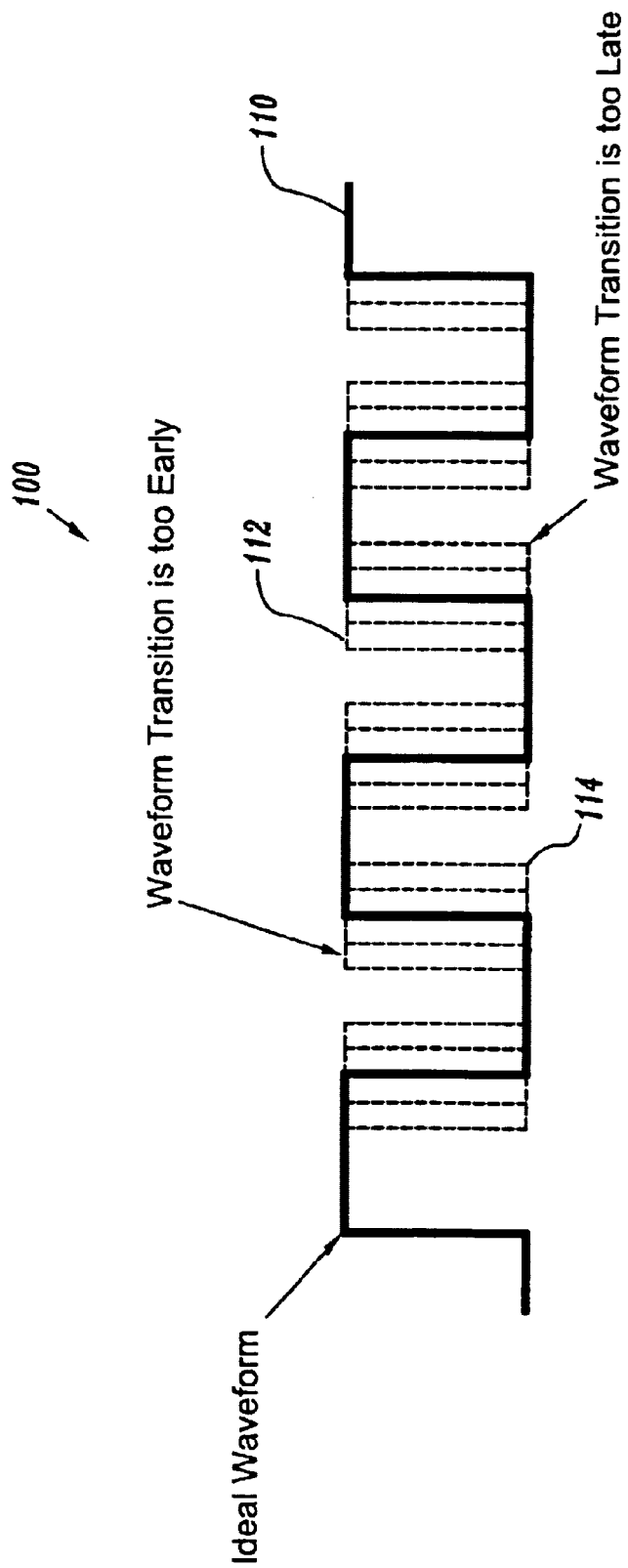
FIG. 1 shows a plot of ideal and jitter waveforms.
Figure 2:
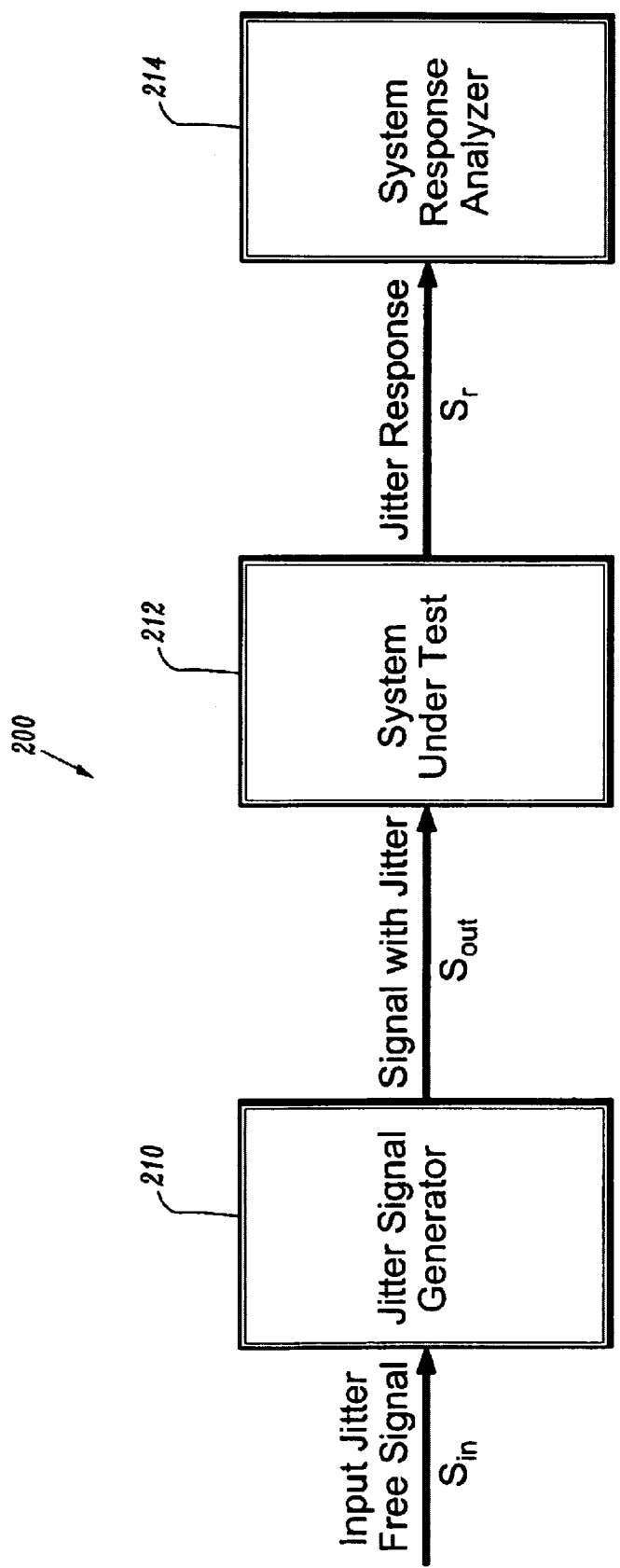
FIG. 2 shows a block diagram of a jitter testing system.

A programmable jitter signal generator and method are provided herein. Embodiments of the programmable jitter signal generator may be used in a test setup as described in FIG. 2. Preferred embodiments of the programmable jitter signal generator are able to generate jitter in a controllable fashion and then deliberately inject the jitter into a data stream, while controlling jitter parameters such as jitter distribution, jitter amplitude and the like, to thereby enable complete and accurate evaluation of a system's jitter tolerance characteristics.

Figure 3:
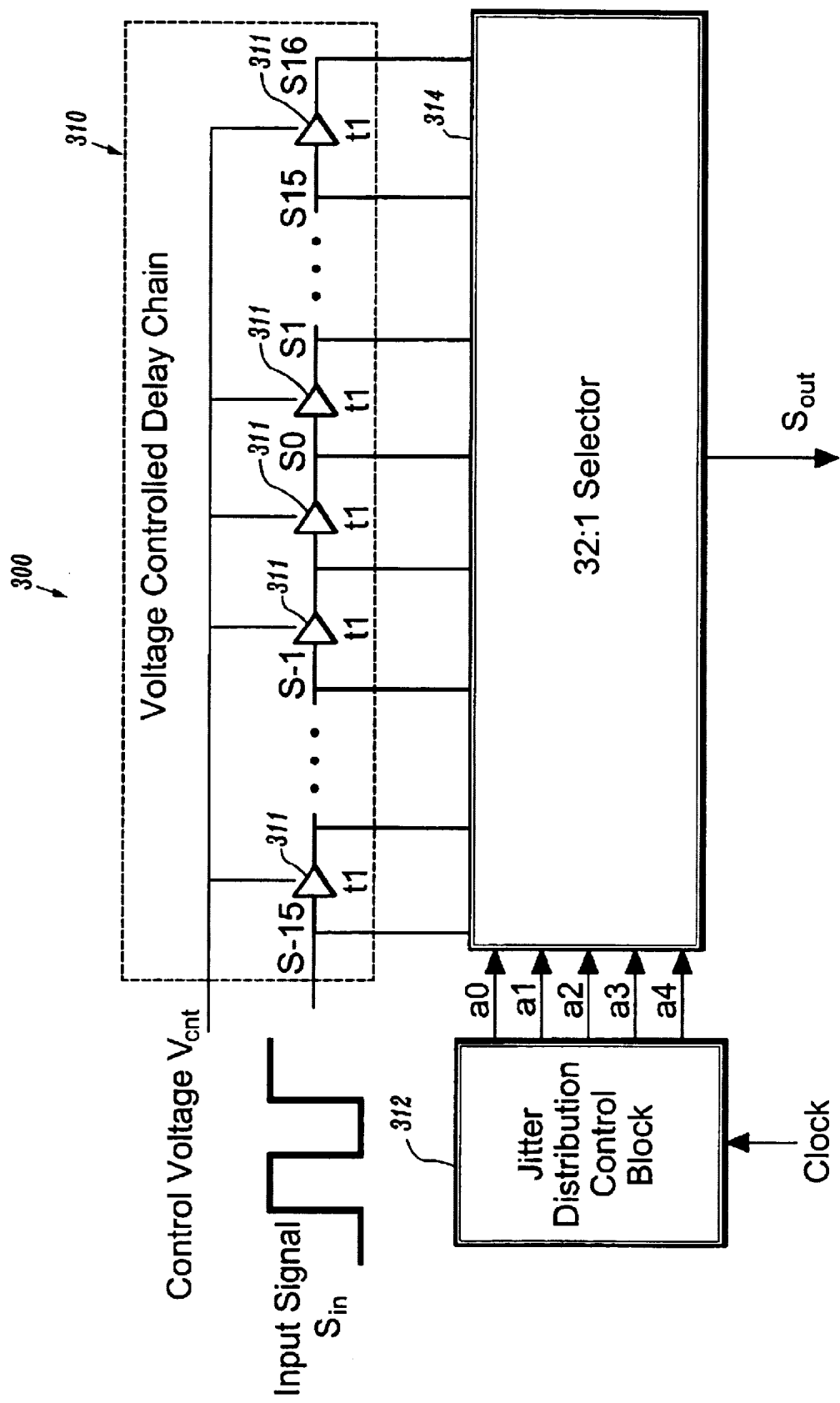
FIG. 3 shows a circuit diagram of a programmable jitter signal generator in accordance with a preferred embodiment of the present disclosure.

As shown in FIG. 3, an exemplary programmable jitter signal generation circuit is indicated generally by the reference numeral 300. The circuit 300 includes a delay chain 310 to adjust the time instants of the rising edge of a jitter-free reference signal. A jitter distribution control block 312 and multiplexer or signal selector 314 are used to select a delay cell for delayed output. Here, the selector 314 is a 32:1 selector, which is in signal communication with each cell of the delay chain 310 and the control block 312. The data distribution in the jitter distribution control block is programmable, and the delay time of the delay cells is also controllable. Therefore, the circuit can create a signal with controllable average jitter, RMS jitter, peak-to-peak jitter, and cycle-to-cycle jitter, which can meet most system test requirements. In addition, the circuit can be integrated onto the circuit of interest for built in self-test ("BIST") applications.

In operation of the circuit 300, the input reference signal Sin enters the delay chain 310 from the left. Sin is a timing signal with very low jitter, such as can be obtained from conventional test equipment. The exemplary delay chain 310 includes 32 delay cells or delay buffers 311, each of which delays the signal by an amount t1. Note that 32 elements are chosen for illustrative purposes, but that any number of delay elements may be included in alternate embodiments to meet application requirements. When the reference signal, Sin, goes through each delay buffer, its rising edge instant will be deviated by time t1.

Figure 4:
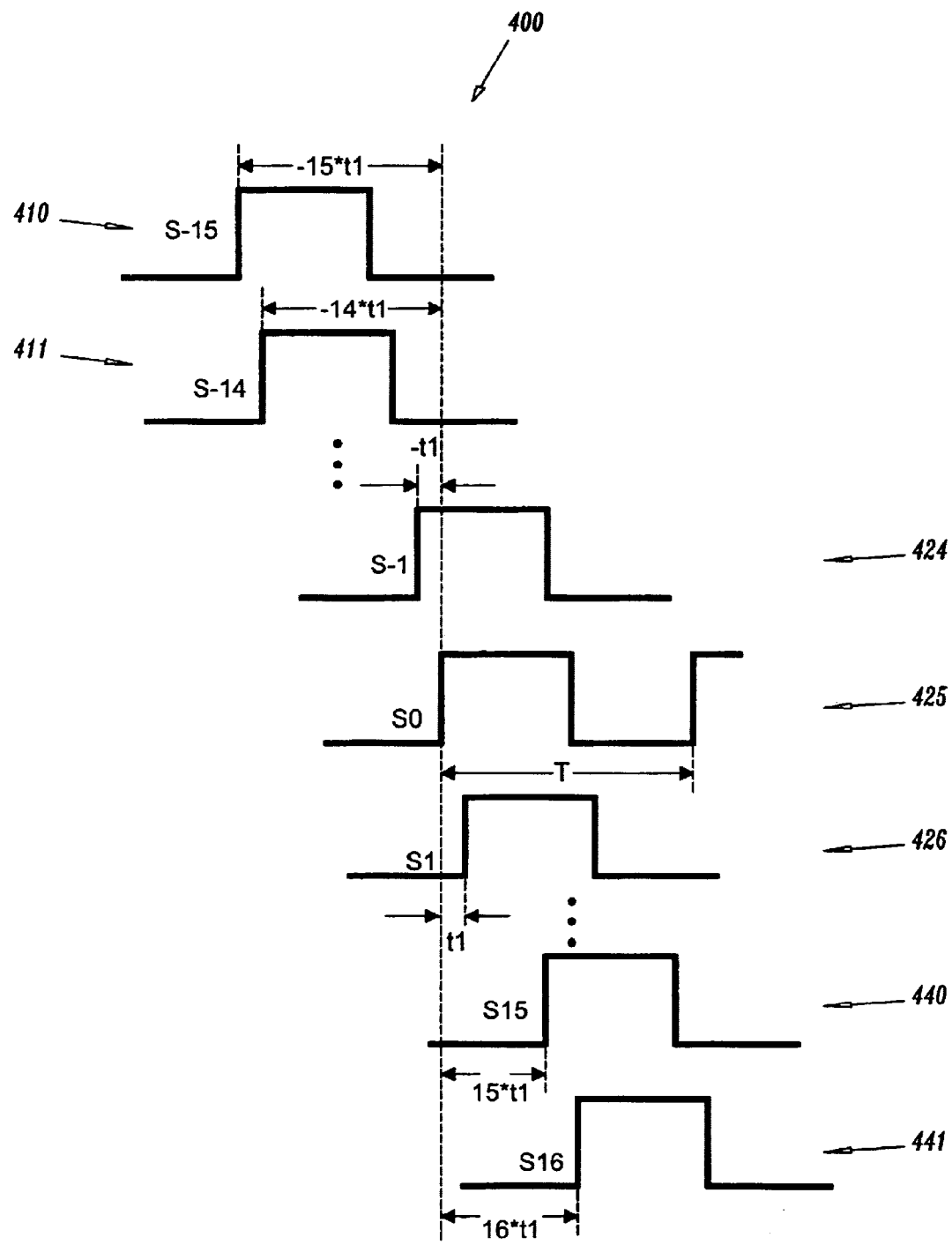
FIG. 4 shows plots of signal delays in accordance with a voltage-controlled delay chain of FIG. 3.

Turning to FIG. 4, a plot of delay increments achievable with the delay chain 310 of FIG. 3 is indicated generally by the reference numeral 400. If the phase of the central cell 311 of FIG. 3 has output referred to as 0, then the whole delay chain could generate timing edges with delays ranging from −15*t1 to 16*t1, which are indicated by the reference numerals 410 through 441, respectively. By changing the length of the delay chain, this jitter amplitude range could be adjusted correspondingly. By adjusting the delay control voltage, the interval t1 can be adjusted to further adjust the jitter distribution. If time intervals smaller than t1 are required, an additional multiplexer with cell delays t2 . . . tn can be added and the Sout of each multiplexer can be fed to an additional final multiplexer.

The output of each delay cell 311 is connected to the corresponding input of a multiplexer or signal selector 314. The five signals a4, a3, a2, a1 and a0 are used to select a signal from the appropriate delay cells and connect it with the output terminal Sout.

The jitter control block 312 of FIG. 3 controls jitter distribution and magnitudes of average jitter, Root Mean Square ("RMS") jitter, peak-to-peak jitter and cycle-to-cycle jitter in the generated signal with jitter, Sout. By setting the data distribution of a4, a3, a2, a1 and a0, the jitter distribution is controlled. The data distribution and the interval t1 are used to calculate the generated average jitter, RMS jitter and peak-to-peak jitter. The cycle-to-cycle jitter equals t1 times any two a4a3a2a1a0 sequences.

Figure 5:
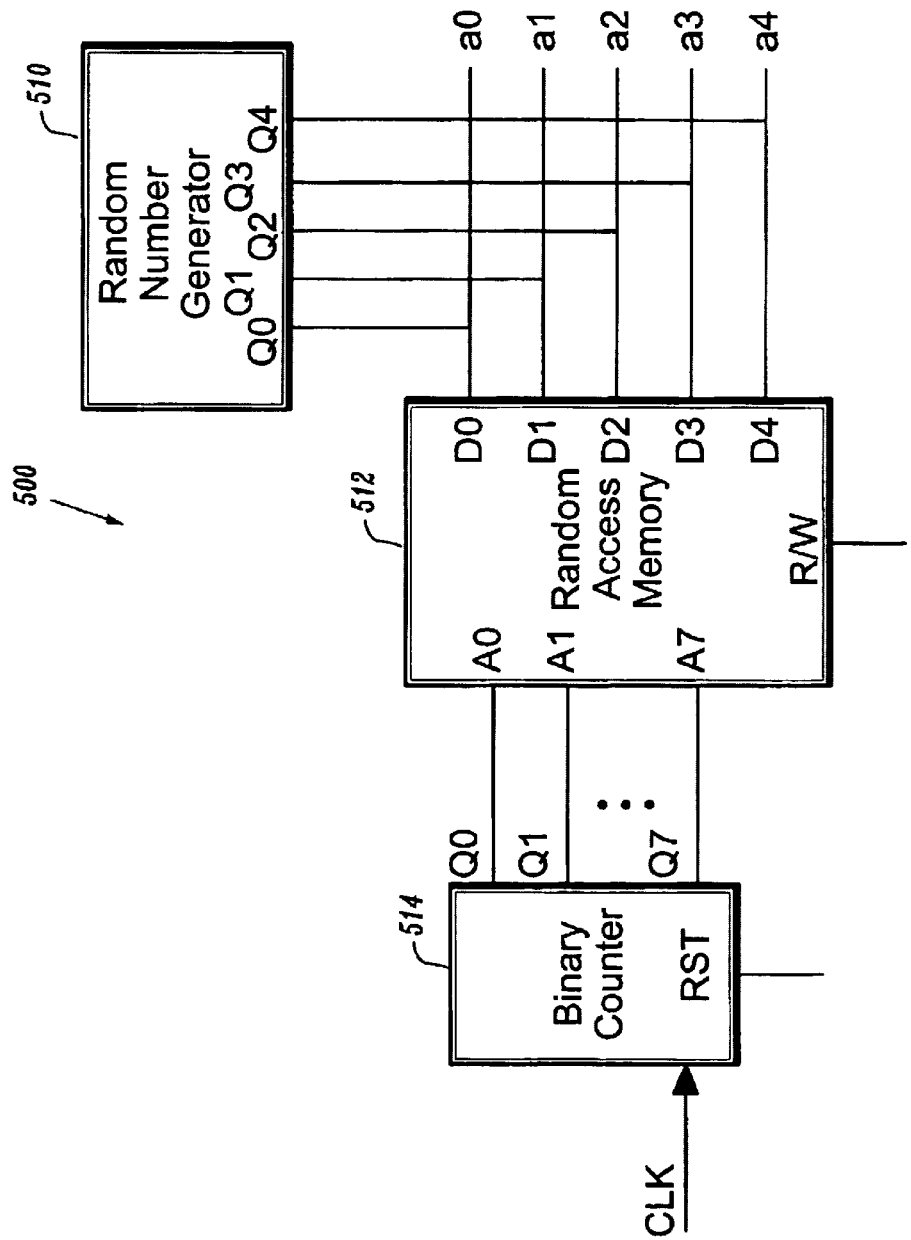
FIG. 5 shows a circuit diagram of a first exemplary jitter distribution control block in accordance with FIG. 3.

Turning now to FIG. 5, an exemplary jitter distribution control block 312 of FIG. 3 is indicated generally by the reference numeral 500. The jitter distribution control block 500 includes a random number generator 510, a random access memory ("RAM") array 512 in signal communication with the generator 510, and a binary counter 514 in signal communication with the RAM array 512.

The design of a jitter distribution control block may follow one of two design schemes. In the first scheme, patterns that create the desired jitter distribution are stored in the RAM, and applied to the multiplexer control signals. In the exemplary jitter distribution control block 500 of FIG. 5, for example, an 8-bit binary counter is utilized. This counter is triggered by the input clock signal CLK, and its output bus [Q7 . . . Q0] is connected to the memory array's address bus [A7 . . . A0]. With the arrival of each CLK's rising edge, the data on the bus [Q7 . . . Q0] is increased by 1, which enables each memory unit to be accessed sequentially. This method provides the greatest flexibility to control the timing jitter.

Figure 6:
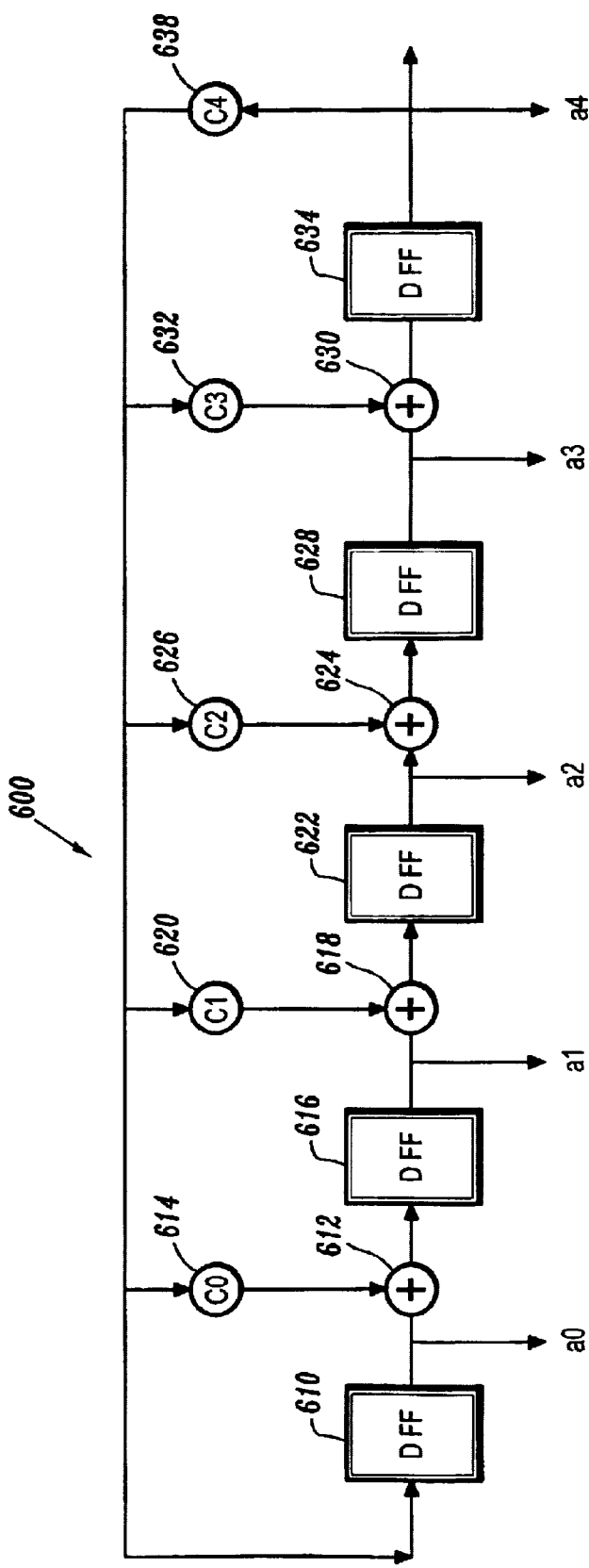
FIG. 6 shows a circuit diagram of a second exemplary jitter distribution control block in accordance with FIG. 3.

As shown in FIG. 6, a circuit implementation of a second jitter distribution control design scheme is indicated generally by the reference numeral 600. The second jitter distribution control circuit 600 includes five D-type flip-flops ("DFF"), 610, 616, 622, 628 and 634, respectively, connected in series signal communication with summing units 612, 618, 624 and 630 therebetween, respectively. Multipliers 614, 620, 626 and 632 are applied to second inputs of each of the summing units, respectively. The output signals a0, a1, a2, a3 and a4 are the respective outputs of each of the DFFs 610 through 634, respectively.

The second jitter distribution control circuit 600 uses this hardware to generate pseudorandom data. In this scheme, linear feedback shift registers ("LFSR") are used to generate pseudorandom numbers. Thus, in the LFSR as is shown in FIG. 6, five DFFs are connected in series to form a pseudorandom number generator. Once the LFSR is triggered, the signal will be shifted from one bit to the next significant bit. At every tap, a weight bit Ci is set to control the feedback from the most significant bit ("MSB"). If the seeds of the LFSR are known, the patterns will be yielded in certain order. In this method, since one can deduce all the random patterns from the LFSR seed, the memory isn't needed to store the generated numbers, simplifying the design.

Figure 7:
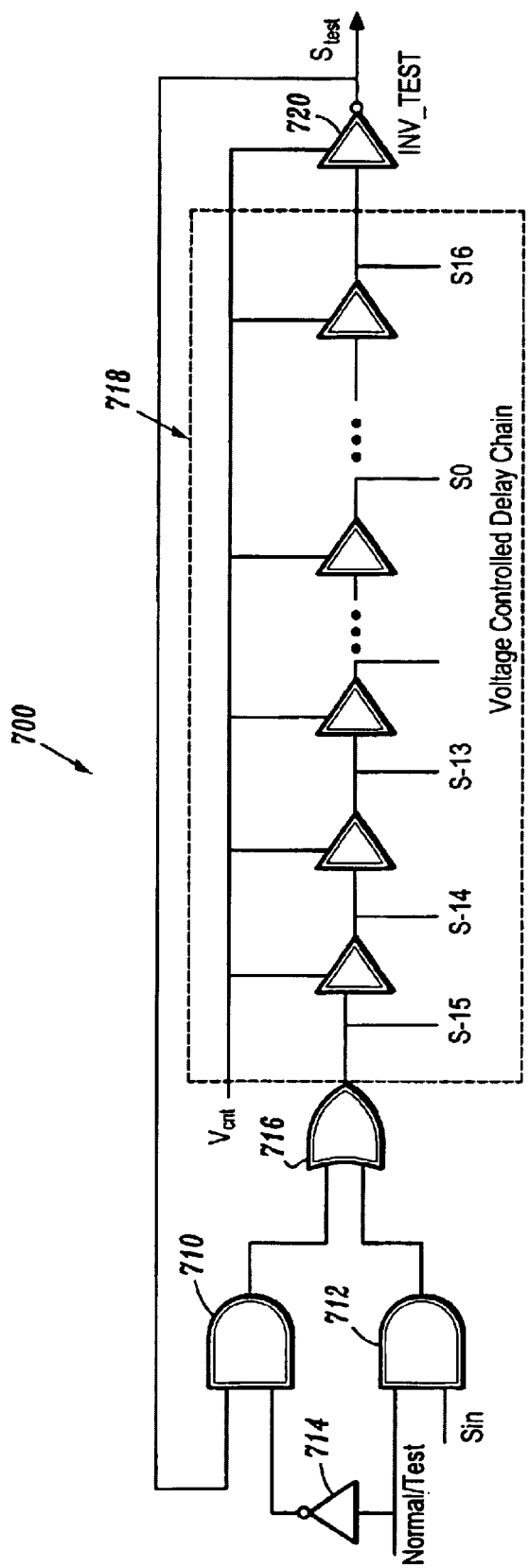
FIG. 7 shows a modified delay chain circuit in accordance with FIG. 3.

Turning to FIG. 7, a modified delay chain circuit is indicated generally by the reference numeral 700. The circuit 700 includes a first AND gate 710 and a second AND gate 712. The second AND gate 712 has a first input terminal for receiving a signal Sin, and a second input terminal for receiving a signal Normal/Test. An inverter 714 is in signal communication between the second input of the second AND gate 712 and a first input of the first AND gate 710. An OR gate 716 is in signal communication with each of the AND gates, receiving the output of the AND 710 on its first input, and receiving the output of the AND 712 on its second input. The output of the OR gate is in signal communication with the Sin input of a delay chain 718, which is comparable to the previously described delay chain 310 of FIG. 3. The delay chain 718 further receives a voltage control signal Vcnt to control the time constants of the delay cells. The output of the delay chain 718 is in signal communication with an inverting cell 720 to provide negative feedback for the modified delay chain circuit 700, which forms an oscillating chain. The inverting cell 720 receives the signal Vcnt as its time constant control input, and outputs a signal Stest. The signal Stest is provided as negative feedback to the second input of the first AND gate 710.

The clock input to the jitter distribution control block determines the rate at which the signals from the delay cell are selected, thereby determining the bandwidth of the jitter of the final signal, Sout. The delay cell chain can be designed in many ways. The major feature is that each cell's delay time t1 should be controllable. Thus, the timing jitter resolution will be adjustable. During each jitter generation process, the delay time t1 of each delay cell should be known. To be able to measure t1, the structure of the delay chain is modified as shown in FIG. 7.

In this modified chain 700, an inverter 720 is added at the end of the original delay chain 718 (or 310 of FIG. 3). This inverter 720 has the exact same structure and size as inverters in the delay buffers. The other four basic logic gates (two AND gate, one OR gate, and one inverter) are applied to set the delay chain into a normal jitter generation mode or into a chain test mode. In the jitter generation mode, a normal/test signal is 1. While in the test mode, the normal/test signal is 0, wherein all delay cells are connected as a ring oscillator. By measuring the frequency of signal Stest, the delay time t1 can be calculated. Since it is known that the delay chain contains n delay buffers, each buffer's delay time is t1 and the last single inverter's delay time is 0.5*t1. Therefore, the frequency of the signal Stest is:

$$f = \frac{1}{2*(n+0.5)*t_1} \quad \text{(Eqn. 1)}$$

Thus, the delay time of the signal Stest is:

$$t_1 = \frac{1}{2*f*(n+0.5)} \qquad \text{(Eqn. 2)}$$

Although illustrative embodiments have been described herein with reference to the accompanying drawings, it is to be understood that the present invention is not limited to those precise embodiments, and that various changes and modifications may be effected therein by one of ordinary skill in the pertinent art without departing from the scope or spirit of the present invention. All such changes and modifications are intended to be included within the scope of the present invention as set forth in the appended claims.

What is claimed is:

1. A programmable jitter signal generator comprising:
   a jitter distribution control unit;
   a selection unit in signal communication with the jitter distribution control unit; and
   a delay unit signal communication with the selection unit, the jitter distribution control unit comprising:
   a binary counter;
   a random access memory in signal communication with the binary counter; and
   a random number generator in signal communication with the random access memory.

2. A programmable jitter signal generator as defined in claim 1 wherein the delay unit comprises a delay chain.

3. A programmable jitter signal generator as defined in claim 1 wherein the selection unit comprises a multiplexer.

4. A programmable jitter signal generator as defined in claim 1 wherein the jitter distribution control unit provides the greatest flexibility to control timing jitter.

5. A programmable jitter signal generator comprising:
   a jitter distribution control unit;
   a selection unit in signal communication with the jitter distribution control unit; and
   a delay unit in signal communication with the selection unit;
   the jitter distribution control unit comprising:
   a plurality of flip-flop devices;
   at least one summing device having one input coupled to the output of a first flip-flop device, and an output coupled to the input of a second flip-flop device; and
   at least one gain device having an output coupled to a second input of the at least one flip-flop device.

6. A programmable jitter signal generator as defined in claim 5, the jitter distribution control unit comprising a plurality of linear feedback shift registers ("LFSR").

7. A programmable jitter signal generator as defined in claim 6 wherein all random patterns can be deduced from an LFSR seed to simplify the design.

8. A programmable jitter signal generator as defined in claim 1, the delay unit comprising a modified delay chain having at least one inverter coupled to the output of a delay chain.

9. A programmable jitter signal generator as defined in claim 1, the delay unit comprising a modified delay chain having at least one logical gate coupled to the input of a delay chain.

10. A method of generating a programmable jitter signal, the method comprising:
    programming a control unit;
    receiving a reference signal;
    delaying the received reference signal by a multiple of a base time increment; and
    selecting a delayed reference signal delayed by a desired multiple of the base time increment in accordance with the programmed control unit,
    wherein programming the control unit comprises:
    initializing a binary counter;
    generating a random number in correspondence with the binary counter; and
    storing the generated random number for later retrieval.

11. A method as defined in claim 10 wherein:
    each multiple of the base time increment corresponds to one of a plurality of delay cells; and
    the delayed reference signal is selected by selecting a delay cell corresponding to the programmed delay of the output.

12. A method as defined in claim 10 wherein delaying the reference signal comprises adjusting the time instants of the rising edge of the received reference signal.

13. A method as defined in claim 10, further comprising controlling jitter distribution of an output signal in accordance with the programmed control unit.

14. A method as defined in claim 10, further comprising controlling average jitter magnitude of an output signal in accordance with the programmed control unit.

15. A method as defined in claim 10 wherein selecting the delayed reference signal comprises multiplexing the delayed reference signal from one of a plurality of delay cells in accordance with the output of the programmed control unit.

16. A method of generating a programmable jitter signal, the method comprising:
    programming a control unit;
    receiving a reference signal;
    delaying the received reference signal by a multiple of a base time increment; and
    selecting a delayed reference signal delayed by a desired multiple of the base time increment in accordance with the programmed control unit,
    wherein programming the control unit comprises:
    providing a plurality of flip-flop devices;
    providing at least one summing device having one input coupled to the output of a first flip-flop device, and an output coupled to the input of a second flip-flop device;
    providing at least one gain device having an output coupled to a second input of the at least one flip-flop device; and
    assigning the gain of the at least one gain device.

17. A method as defined in claim 16, further comprising arranging the provided flip-flop, summing and gain devices to operate as linear feedback shift registers ("LFSR").

18. A method as defined in claim 16, further comprising deducing generated random jitter patterns from an LFSR seed.

19. A method as defined in claim 10, further comprising inverting the output of a delay chain.

* * * * *